United States Patent
Gonzales et al.

(10) Patent No.: US 7,390,680 B2
(45) Date of Patent: Jun. 24, 2008

(54) METHOD TO SELECTIVELY IDENTIFY RELIABILITY RISK DIE BASED ON CHARACTERISTICS OF LOCAL REGIONS ON THE WAFER

(75) Inventors: Ramon Gonzales, Gresham, OR (US); Kevin Cota, Portland, OR (US); Manu Rehani, Portland, OR (US); David Abercrombie, Gresham, OR (US)

(73) Assignee: LSI Corporation, Milpitas, CA (US)

( * ) Notice: Subject to any disclaimer, the term of this patent is extended or adjusted under 35 U.S.C. 154(b) by 402 days.

(21) Appl. No.: 11/031,564

(22) Filed: Jan. 6, 2005

(65) Prior Publication Data

US 2005/0145841 A1  Jul. 7, 2005

Related U.S. Application Data

(62) Division of application No. 10/454,027, filed on Jun. 4, 2003, now Pat. No. 6,880,140.

(51) Int. Cl.
*G01R 31/26* (2006.01)
(52) U.S. Cl. .................. 438/14; 257/375; 257/E21.135
(58) Field of Classification Search ................ 438/478, 438/184, 193, 195–198, 200–203, 206–207, 438/209–211, 218, 237, 165, 294, 308, 337, 438/353, 6, 10, 104, 107–114, 118, 121–123, 438/128–129, 135, 142, 145, 149, 151, 157, 438/176
See application file for complete search history.

(56) References Cited

U.S. PATENT DOCUMENTS

| | | | | |
|---|---|---|---|---|
| 5,642,307 | A * | 6/1997 | Jernigan | ..................... 365/103 |
| 6,219,908 | B1 * | 4/2001 | Farnworth et al. | ............ 29/833 |
| 6,393,602 | B1 | 5/2002 | Atchison et al. | |
| 6,477,685 | B1 | 11/2002 | Lovelace | |
| 6,483,938 | B1 | 11/2002 | Hennessey et al. | |
| 6,507,933 | B1 | 1/2003 | Kirsch et al. | |
| 6,678,668 | B2 | 1/2004 | Fisher et al. | |
| 7,194,366 | B2 * | 3/2007 | Singh et al. | ................... 702/81 |

OTHER PUBLICATIONS

Barnett, Thomas S. et al., "Burn-In Failures and Local Region Yield: An Integrated Yield-Reliability Model", Auburn University.
Barnett, Thomas S. et al., "Yield-Reliability Modeling: Experimental Verification and Application to Burn-In Reduction", Auburn University.

* cited by examiner

*Primary Examiner*—Michael S. Lebentritt
*Assistant Examiner*—Andre' Stevenson
(74) *Attorney, Agent, or Firm*—Trexler, Bushnell, Giangiorgi & Blackstone, Ltd.

(57) ABSTRACT

A method and system for selectively identifying reliability risk die based on characteristics of local regions on a wafer by computing particle sensitive yield and using the particle sensitive yield to identify reliability risk die. Specifically, a bin characteristics database which identifies hard and soft bins that are sensitive to different failure mechanisms is maintained, and the bin characteristics database is used to compute particle sensitive yield. It is determined whether the particle sensitive yield of the local region around the current die is less than a pre-set threshold, and the die is downgraded if the particle sensitive yield of the local region around the current die is less than the pre-set threshold. If the particle sensitive yield of the local region around the current die is not less than the pre-set threshold, the die is not downgraded.

10 Claims, 3 Drawing Sheets

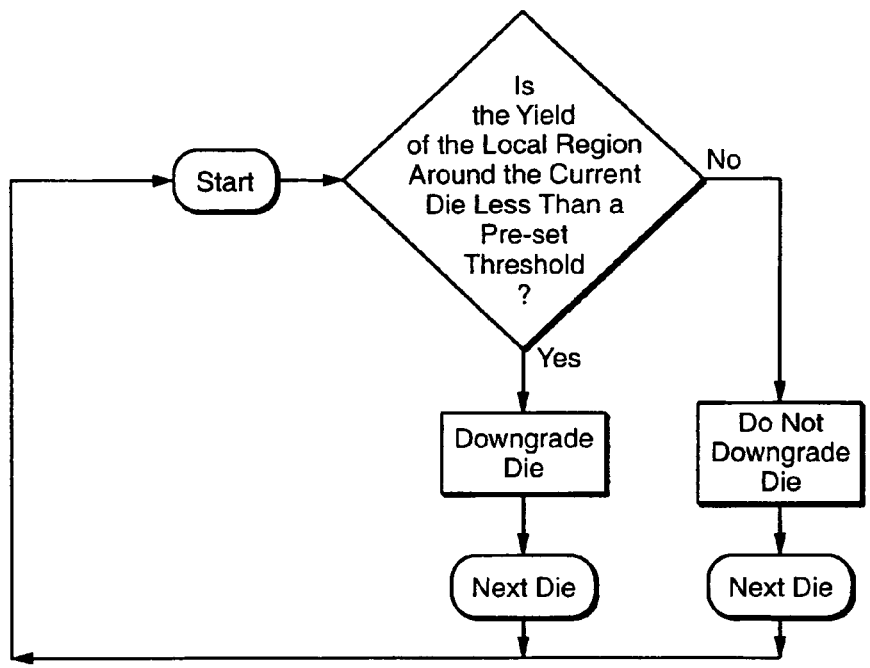
FIG._1 *(PRIOR ART)*
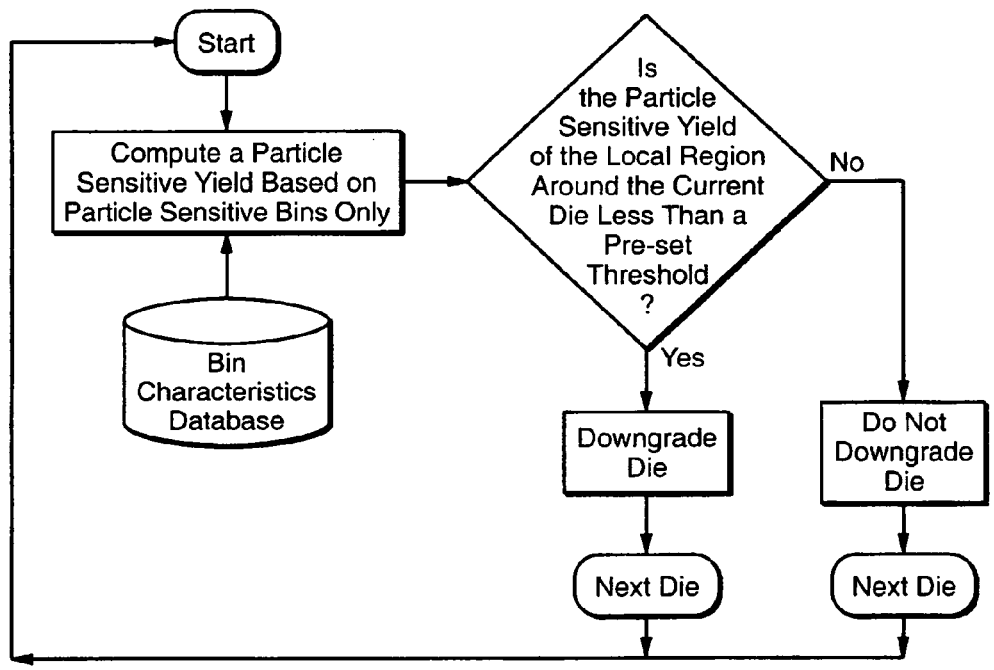
FIG._2

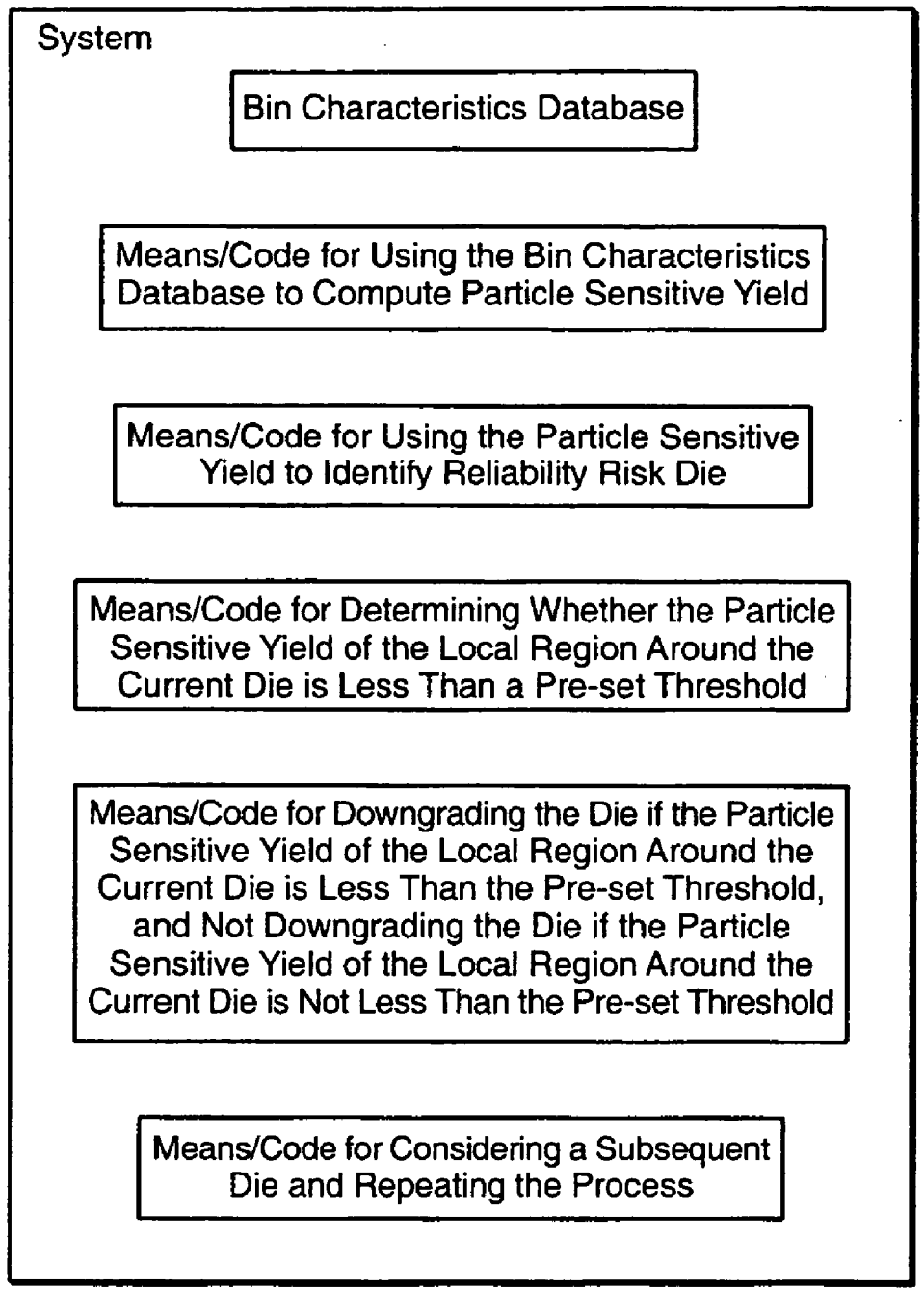
FIG._3

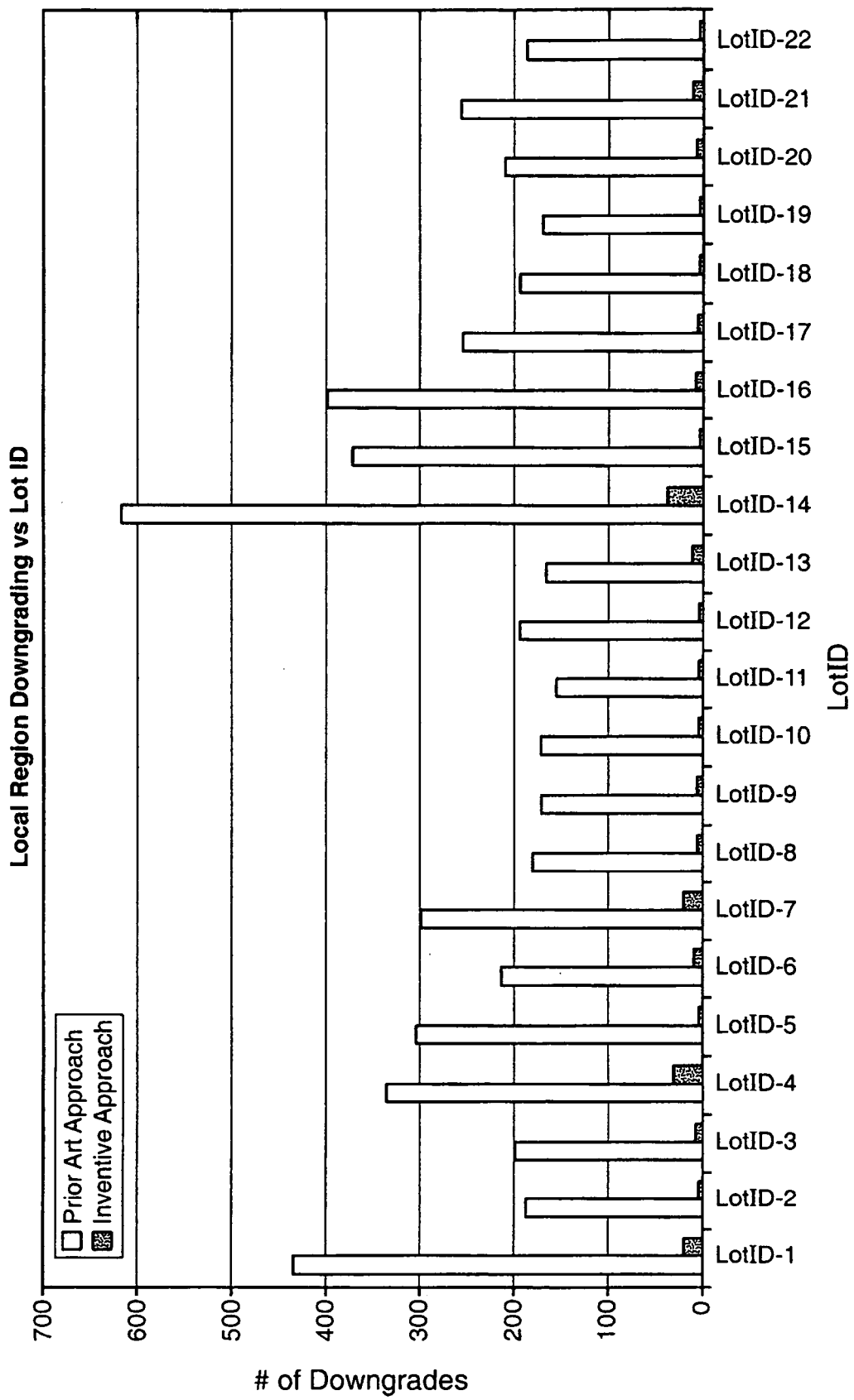
FIG._4

METHOD TO SELECTIVELY IDENTIFY RELIABILITY RISK DIE BASED ON CHARACTERISTICS OF LOCAL REGIONS ON THE WAFER

CROSS-REFERENCE

This patent application is a divisional of U.S. patent application Ser. No. 10/454,027, filed on Jun. 4, 2003, and entitled "A Method to Selectively Identify Reliability Risk Die Based on Characteristics of Local Regions on the Wafer".

BACKGROUND

The present invention generally relates to methods and systems for identifying reliability risk die on a wafer, and more specifically relates to a method and system for selectively identifying reliability risk die based on characteristics of local regions on the wafer.

Presently, in identifying reliability risk die on a wafer, it is typically assumed that failing die are primarily caused by particle type defects, that particle type defects occur in localized regions on the wafer, and that test coverage is never 100 percent, so die with actual defects will still pass wafer sort tests. Hence, good die in bad regions are likely to be reliability risks.

A prior art approach at identifying reliability risk die on the wafer is illustrated in FIG. 1. A threshold is pre-set with regard to yield in the local region around the die. If the yield is less than the pre-set threshold, the die is downgraded. On the other hand, if the yield is not less than the pre-set threshold, the die is not downgraded. The problem with the approach is that, contrary to the first assumption identified above, not all failing die are due to particle type defects. Hence, the approach illustrated in FIG. 1 typically results in excessive downgrading.

OBJECTS AND SUMMARY

An object of an embodiment of the present invention is to provide a method and system for identifying reliability risk die based on characteristics of local regions on the wafer, which results in a 80-90% reduction in fallout.

Another object of an embodiment of the present invention is to provide a method and system for identifying reliability risk die based on characteristics of local regions on the wafer, which results in better resolution of reliability risk die.

Briefly, and in accordance with at least one of the foregoing objects, an embodiment of the present invention provides a method and system for selectively identifying reliability risk die based on characteristics of local regions on a wafer by computing particle sensitive yield and using the particle sensitive yield to identify reliability risk die. Specifically, a bin characteristics database which identifies hard and soft bins that are sensitive to different failure mechanisms is maintained, and the bin characteristics database is used to compute particle sensitive yield. It is determined whether the particle sensitive yield of the local region around the current die is less than a pre-set threshold, and the die is downgraded if the particle sensitive yield of the local region around the current die is less than the pre-set threshold. If the particle sensitive yield of the local region around the current die is not less than the pre-set threshold, the die is not downgraded.

BRIEF DESCRIPTION OF THE DRAWINGS

The organization and manner of the structure and operation of the invention, together with further objects and advantages thereof, may best be understood by reference to the following description, taken in connection with the accompanying drawing, wherein:

FIG. 1 illustrates a prior art approach at identifying reliability risk die on the wafer;

FIG. 2 illustrates an approach at selectively identifying reliability risk die based on characteristics of local regions on a wafer, where the approach is in accordance with an embodiment of the present invention;

FIG. 3 illustrates a system which is in accordance with an embodiment of the present invention, and which can be used to perform the method illustrated in FIG. 2; and FIG. 4 illustrates the reduction in fallout as a result of using the method and system illustrated in FIGS. 2 and 3.

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

As shown in FIG. 2, an embodiment of the present invention provides a method for selectively identifying reliability risk die based on characteristics of local regions on a wafer by computing particle sensitive yield and using the particle sensitive yield to identify reliability risk die. Specifically, a bin characteristics database which identifies hard and soft bins that are sensitive to different failure mechanisms (like particles) is maintained, and the bin characteristics database is used to compute particle sensitive yield. It is determined whether the particle sensitive yield of the local region around the current die is less than a pre-set threshold, and the die is downgraded if the particle sensitive yield of the local region around the current die is less than the pre-set threshold. If the particle sensitive yield of the local region around the current die is not less than the pre-set threshold, the die is not downgraded.

FIG. 3 illustrates a system which is in accordance with an embodiment of the present invention, and which can be used to perform the method illustrated in FIG. 2. As shown, the system includes a bin characteristics database which identifies hard and soft bins that are sensitive to different failure mechanisms (like particles), and means, such as code, for using the bin characteristics database to compute particle sensitive yield. The system also includes means, such as code, for using the particle sensitive yield to identify reliability risk die, and means, such as code, for determining whether the particle sensitive yield of the local region around the current die is less than a pre-set threshold. The system includes means, such as code, for downgrading the die if the particle sensitive yield of the local region around the current die is less than the pre-set threshold, and not downgrading the die if the particle sensitive yield of the local region around the current die is not less than the pre-set threshold. The system also includes means, such as code, for considering a subsequent die and repeating the process.

As shown in FIG. 4, the present invention provides an approach at identifying reliability risk die based on characteristics of local regions on the wafer, which can result in a 80-90% reduction in fallout. In each of the vertical bar pairs for each lot, the left-most vertical bar corresponds to the prior art approach shown in FIG. 1, and the right-most vertical bar corresponds to the inventive approach shown in FIG. 2. The present invention provides an approach which results in better resolution of reliability risk die.

While an embodiment of the present invention is shown and described, it is envisioned that those skilled in the art may devise various modifications of the present invention without departing from the spirit and scope of the appended claims.

What is claimed is:

1. A system to selectively identify reliability risk die based on characteristics of local regions on a wafer, said system comprising: means for computing particle sensitive yield of a local region around a die on the wafer, wherein the particle sensitive yield relates to a particles failure mechanism; and means for using the particle sensitive yield to identify whether the die may be a reliability risk based on the particle sensitive yield which was computed; and means for repeating the process for additional die on the wafer, wherein reliability risk die are identified based specifically on particle sensitive yield of the local region around the die, rather than mere yield.

2. A system as recited in claim 1, further comprising a bin characteristics database.

3. A system as recited in claim 2, wherein the bin characteristics database identifies hard and soft bins that are sensitive to different failure mechanisms.

4. A system as recited in claim 3, wherein the bin characteristics database identifies hard and soft bins that are sensitive to particle type defects.

5. A system as recited in claim 1, wherein the means for computing particle sensitive yield comprises code.

6. A system as recited in claim 1, further comprising a bin characteristics database, and means for using the bin characteristics database to compute particle sensitive yield.

7. A system as recited in claim 1, further comprising means for determining whether the particle sensitive yield of the local region around the current die is less than a pre-set threshold.

8. A system as recited in claim 7, further comprising means for downgrading the die if the particle sensitive yield of the local region around the current die is less than the pre-set threshold.

9. A system as recited in claim 7, further comprising means for downgrading the die if the particle sensitive yield of the local region around the current die is less than the pre-set threshold, and not downgrading the die if the particle sensitive yield of the local region around the current die is not less than the pre-set threshold.

10. A system as recited in claim 9, further comprising means for considering a subsequent die and repeating the process.

* * * * *